United States Patent
Walk

(10) Patent No.: US 7,186,365 B2
(45) Date of Patent: Mar. 6, 2007

(54) METHODS FOR FORMING AN IMPRINTING TOOL

(75) Inventor: Michael Walk, Mesa, AZ (US)

(73) Assignee: Intel Corporation, Santa Clara, CA (US)

( * ) Notice: Subject to any disclaimer, the term of this patent is extended or adjusted under 35 U.S.C. 154(b) by 132 days.

(21) Appl. No.: 10/456,189

(22) Filed: Jun. 5, 2003

(65) Prior Publication Data

US 2004/0247732 A1    Dec. 9, 2004

(51) Int. Cl.
*B29C 33/38*    (2006.01)
*B29C 33/56*    (2006.01)

(52) U.S. Cl. .................. 264/494; 264/39; 264/130; 264/134; 264/162; 264/219; 264/227; 264/238; 427/133

(58) Field of Classification Search .............. 264/39, 264/227, 134, 494, 130, 162, 238, 219; 427/133
See application file for complete search history.

(56) References Cited

U.S. PATENT DOCUMENTS

| | | | | |
|---|---|---|---|---|
| 3,565,978 A | * | 2/1971 | Folger et al. | 264/1.34 |
| 4,124,672 A | * | 11/1978 | Jarsen | 264/129 |
| 5,204,055 A | * | 4/1993 | Sachs et al. | 419/2 |
| 5,296,178 A | * | 3/1994 | Sugihara et al. | 264/130 |
| 5,439,622 A | * | 8/1995 | Pennisi et al. | 264/401 |
| 6,341,952 B2 | * | 1/2002 | Gaylo et al. | 425/84 |
| 6,476,122 B1 | * | 11/2002 | Leyden | 524/577 |
| 6,616,867 B2 | * | 9/2003 | Kerfeld | 264/1.33 |
| 2002/0108860 A1 | * | 8/2002 | Staats | 204/601 |

* cited by examiner

*Primary Examiner*—Suzanne E. McDowell
(74) *Attorney, Agent, or Firm*—Schwegman, Lundberg, Woessner & Kluth, P.A.

(57) ABSTRACT

Numerous embodiments of a method and apparatus for forming an imprinting tool are disclosed. In one embodiment, a method of forming an imprinting tool comprises forming a first mold by use of one or more printing processes, forming a second mold from the first mold, and forming an imprinting tool from the second mold, where the imprinting tool is formed at least in part by metalizing at least a portion of the second mold.

16 Claims, 3 Drawing Sheets

METHODS FOR FORMING AN IMPRINTING TOOL

BACKGROUND

Boards used in electronic assemblies, such as a printed circuit boards (PCB) or motherboards, for example, may be formed at least in part from ceramic or organic materials. In this context, boards may be referred to as substrates, and may comprise a number of substrate layers. The one or more layers of these substrates may include conductive structures such as patterned interconnect lines, including traces and trenches, for example. Additionally, one or more through holes, which may be referred to as vias or plated through holes, may be formed between layers of the substrate, and may, along with other conductive structures, provide signal paths between electronic components mounted on the substrate, from one side of a substrate to another, or between layers of the substrate, for example. Conductive structures such as these may be formed by imprinting one or more layers of a thermoset and/or thermoplastic polymer based substrate with one or more imprinting tools, such as a microtool. Imprinting tools such as microtools form voids in the layers of the substrate that may be later metalized, in order to complete the formation of conductive structures.

Numerous techniques exist for fabricating microtools that may be used in the formation of conductive structures in substrates, for example. Current state of the art techniques for fabricating microtools comprise building up multiple sublayers using photolithography and plating processes, where the built up sublayers, when completed, form features of a microtool. However, these state of the art methods for forming microtools are complex and time consuming, and, due to tolerance variations in lithography and plating processes, result in difficulties in fabricating microtools with particular geometries or within particular tolerances. A need, therefore, exists for an improved method for forming microtools, which addresses some of these limitations.

BRIEF DESCRIPTION OF THE DRAWINGS

The subject matter regarded as embodiments of the claimed subject matter is particularly pointed out and distinctly claimed in the concluding portion of the specification. Embodiments of the claimed subject matter, however, both as to organization and method of operation, together with objects, features, and advantages thereof, may best be understood by reference to the following detailed description when read with the accompanying drawings in which:

DETAILED DESCRIPTION

Figure 1:
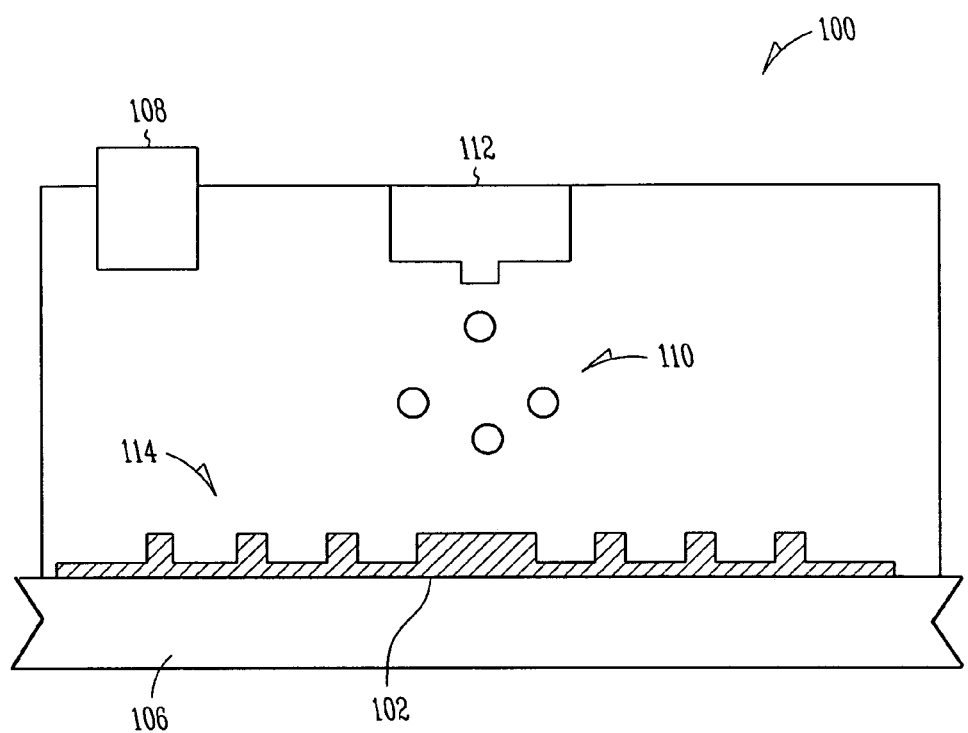
FIG. 1 illustrates one phase of formation of a microtool, in accordance with one embodiment of the claimed subject matter.

Embodiments of the claimed subject matter may comprise a method and apparatus for forming an imprinting tool. In one embodiment, a method of forming an imprinting tool comprises forming a first mold by use of one or more printing processes, forming a second mold from the first mold, and forming an imprinting tool from the second mold, where the imprinting tool is formed at least in part by metalizing at least a portion of the second mold.

As mentioned previously, an imprinting tool, which may also be referred to as a microtool, may be used to form features that will be formed into conductive structures, in layers of a substrate. A substrate with features formed by a microtool may then be used to form an electronic assembly, for example. An electronic assembly may comprise one or more electronic components coupled to a substrate, which may be a multilayer substrate, wherein the substrate is at least partially formed by use of one or more microtools, for example. In this context, an electronic assembly may comprise one or more electronic components coupled to one or more substrates, and one or more electronic assemblies may be coupled to form an electronic device. Examples of electronic devices may include desktop computers, laptop computers, palmtop or handheld computers, servers, routers, cellular phones, printers, digital cameras, and the like.

Present state of the art methods for fabrication of imprinting devices such as microtools may incorporate multiple process steps. One particular technique for forming a microtool may utilize the one or more photolithography and plating processes to build up multiple layers in order to produce a tool with desired features. This particular embodiment may incorporate the steps of first applying a photodefinable resist material to a base of glass or silicon. A pattern is then exposed on the resist material, and the resist is then developed and etched. Electroless or sputter deposition is then used to deposit a layer of metal on the etched areas. Electroplating may then be used to build up the areas of the tool where metal is deposited. The resist material is then removed, and the tool may be polished and annealed in one or more finishing steps. As indicated previously, this technique may be very time consuming, and may not allow particular control over resultant feature geometries of the microtool, such as the draft angle, which is the angle between the top sidewall edge of a microtool feature to the bottom sidewall edge of a microtool feature in reference to the base surface of the microtool.

It is worthy to note that any reference in the specification to "one embodiment" or "an embodiment" means that a particular feature, structure, or characteristic described in connection with the embodiment is included in at least one embodiment of the claimed subject matter. The appearances of the phrase "in one embodiment" in various places in the specification are not necessarily all referring to the same embodiment.

Numerous specific details may be set forth herein to provide a thorough understanding of the embodiments of the claimed subject matter. It will be understood by those skilled in the art, however, that particular embodiments may be practiced without these specific details. In other instances, well-known methods, procedures and components have not been described in detail so as not to obscure particular embodiments. It can be appreciated that the specific structural and functional details disclosed herein may be representative and do not necessarily limit the scope of particular embodiments.

Referring now in detail to the drawings wherein like parts are designated by like reference numerals throughout, there is illustrated in FIG. 1 one phase of formation of an imprinting tool. Phase 100 illustrates formation of master mold 102. Master mold 102 is formed by depositing a material, such as an ultraviolet (UV) curable polymer resin, on a build platform 106. In this embodiment, the material is deposited by use of a three-dimensional printing process performed by an ink-jet head 112, which may be configured on an apparatus capable of traversing the build area, wherein the apparatus may be controlled by a computer (not shown). The material is deposited on the build platform to parameters defining particular dimensions of a microtool, which may be determined based on desired features for a substrate, for example. As the ink-jet head 112 deposits droplets of material 110, a UV lamp 108 may cure the material upon disposition, and features on feature surface 114 may be formed on the master mold 102, and may be formed by the deposition and curing of multiple layers of material. In one embodiment, a UV curable resin is deposited by use of a 3-D ink-jet printing process, by an ink-jet head with a print resolution of 600 dots per inch (dpi) in an X direction and 300 dpi in a Y direction. The assembly used in phase 100 may incorporate a build platform 106 coupled to a UV lamp 108 and an ink-jet head 112, for example, and may be controlled by a computer, for example, although particular embodiments are not so limited.

Figure 2:
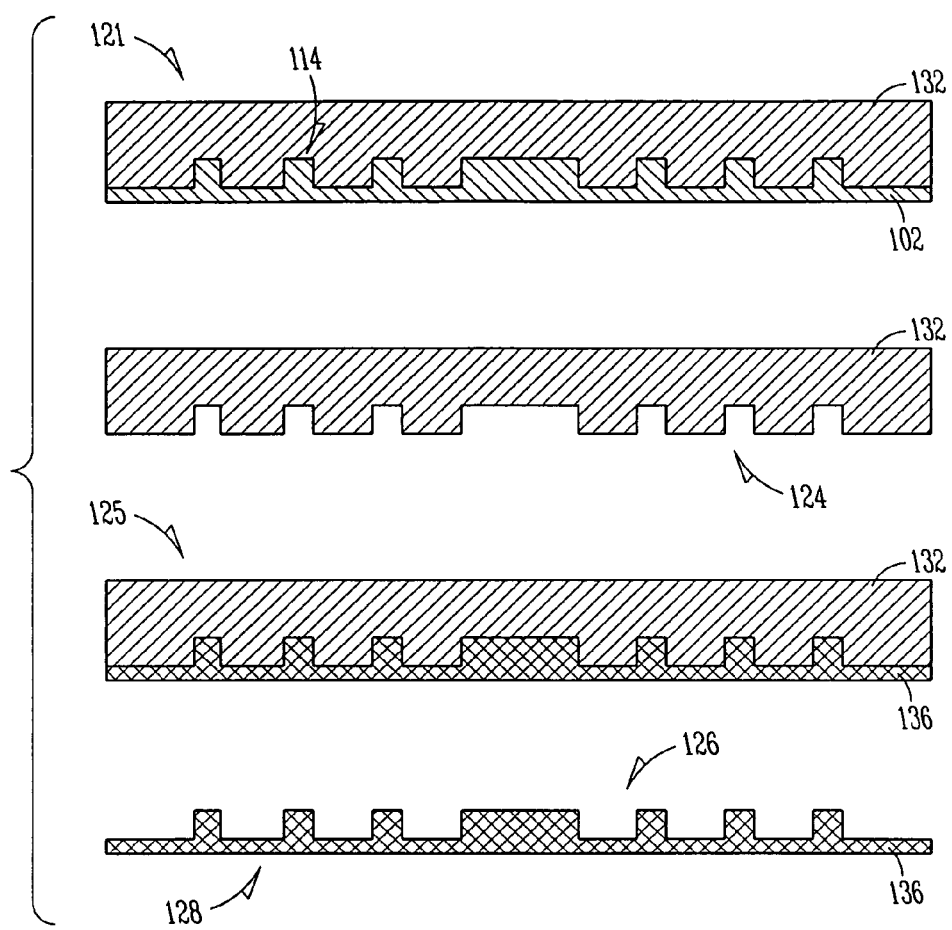
FIG. 2 illustrates multiple phases of formation of a microtool, in accordance with one embodiment of the claimed subject matter.

FIG. 2 illustrates additional phases of formation of a microtool, and the resultant microtool 136, comprising a base 128 and a feature surface 126. After completion of the printing process of phase 100, the formed master mold 102 is removed from the printing and curing apparatus, and a parent mold 132 is created. Parent mold 132 may be created by one or more molding processes, but one particular embodiment may comprise coating the feature surface 114 of the master mold with a material such as curable polymer, as shown in phase 121. This material may be coated on a substantial portion of the feature surface 114 of master mold 102, and may be allowed to cure after coating. Curing, in one embodiment, may comprise elevating the temperature for a particular period of time, such as elevating to the cure temperature for a particular period of time, as just an example. Once curing of the material is completed, the master mold 102 and parent mold 132 having a feature surface 124 may be separated, and parent mold 132 is used in phase 125 of formation of microtool 136. In phase 125, parent mold 132 may undergo one or more metalization processes, for example, wherein the metal material(s) used for metalization may comprise, for example, nickel, copper and/or aluminum. Parent mold 132 may have a material or combination of material applied to the feature surface 124 formed in the previous phase, by one or more metalization processes such as metal deposition or metal filled paste screen printing, for example. In one embodiment, a sputter deposition process is used to apply metal to one or more surfaces of parent mold 132, and therefore the features formed on the surface 124 of parent mold 132 are substantially coated in metal. After completion of these one or more processes, parent mold 132 and the resultant microtool 136 may be separated. At least a portion of microtool 136, such as the feature surface 126 and/or the base 128, may undergo one or more finishing processes such as annealing, cleaning or polishing, for example, prior to use as a tool for forming features on a substrate.

Figure 3:
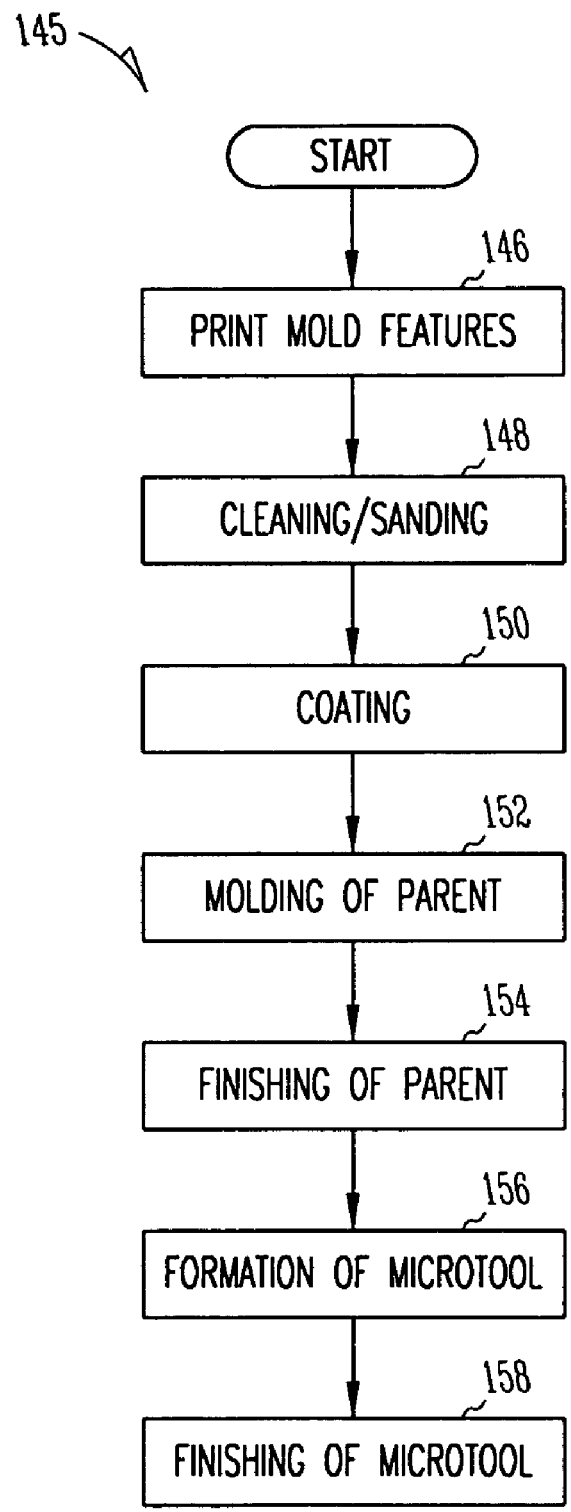
FIG. 3 is a process flow diagram depicting one embodiment of the claimed subject matter.

FIG. 3 illustrates the process flow 145 that may be utilized in one embodiment of the formation of an imprinting tool, such as microtool 136 with feature surface 126 and base 128 of FIG. 2. Although FIG. 3 illustrates a particular process flow, the order presented does not infer a particular order of execution, nor does it infer that all functional blocks need be performed in all embodiments. In this embodiment, at block 146, features are printed to form a master mold, by use of an ink-jet printing process, for example; at block 148, the resultant master mold may be cleaned and sanded, for example; at block 150, the master mold may be coated with a non-stick coating and/or a metal layer, for example; at block 152, the master mold is subjected to a molding process to produce a parent mold, by use of one or more well known molding techniques; at block 154, the resultant parent mold may be finished, which may include cleaning, polishing or coating, for example; at block 156, a microtool is formed by use of the parent tool, and may be formed by one or more metalization processes, for example; and, at block 158, the microtool is finished, which may include one or more machining, cleaning, or curing processes, for example.

In this embodiment, at functional block 146, features may be imprinted to form a master mold. As described previously, the features may be imprinted by use of an inkjet device, and may be cured by a UV lamp, but it is important to note that the claimed subject matter is not so limited. Other methods of forming a master mold, such as, for example, casting or machining, may be used in alternative embodiments, and still be in accordance with the claimed subject matter. Any method that results in the formation of a master mold may be in accordance with at least one embodiment, for example.

In this embodiment, at functional block 148, the master mold may be cleaned and/or sanded. In one embodiment, low-pressure water is used to clean material from the surface of the master mold, and the master mold is then lightly sanded or given a surface roughness in order to facilitate further processes. However, any method of treatment of a master mold that enables the master mold to be used in further processes is in accordance with at least one embodiment. For example, clean dry air may be used to clean a master mold, and then sandblasting may be used to prepare the surface of the master mold, for example.

In this embodiment, at functional block 150, the master mold may be coated with a material, such as a non-stick and or metal layer, for example. This functional block may be used to further facilitate additional formation steps as described hereinafter. In one embodiment, a layer of metal may be deposited on at least a portion of the feature surface of the master mold, by use of a sputter deposition process, for example. It is important to note, however, that this particular process will depend at least in part on the materials used to form the parent mold, and may vary and still be in accordance with the claimed subject matter.

In this embodiment, at functional block 152, a parent mold is produced by using the master mold. The parent mold may be formed from numerous materials, but in one embodiment, a UV curable polymer is used to substantially form the parent mold, and may be formed in the following manner: UV curable polymer may be deposited on the feature surface of the master mold, by an inkjet head, for example. Once the features are substantially filled with UV curable polymer, the material may be cured by use of a UV lamp. The master mold and the parent mold may be separated after curing, and the parent mold may be finished in functional block 154.

In this embodiment, at functional block 154, the parent mold may undergo one or more finishing processes. These one or more finishing processes may depend at least in part on the material used to form the parent mold, but in one embodiment, a UV curable polymer is used to form the parent mold, and the parent mold may undergo one or more cleaning and surface preparation functions, as described in detail in reference to functional block 148, for example.

In this embodiment, at functional block 156, a microtool may be formed, and the microtool may be formed by use of the parent mold. Numerous methods of forming the microtool may be used in various embodiments, but in one particular embodiment, a metal deposition process may be used to form the microtool, in the following manner: the parent mold may be configured to receive metal material on the feature side of the mold. One or more sputter deposition processes may be used to deposit a layer of metal on at least a portion of the features of the parent mold, to a depth such that the microtool may be used as described herein. Alternatively, a metal paste may be forced into the features, and may be then cured. Other methods of forming a microtool from the parent mold, such as, for example, metal casting, may be used in alternative embodiments, and still be in accordance with the claimed subject matter. Any method that results in the formation of a microtool from a parent mold may be in accordance with at least one embodiment, for example.

In this embodiment, at functional block 158, microtool may undergo one or more finishing processes. These one or more finishing processes may depend at least in part on the type of material(s) used to form the microtool, but examples of finishing processes may include sanding, machining, polishing or cleaning, for example. While numerous finishing techniques may be used, it is important to note that other methods of finishing a microtool may be used in alternative embodiments, and still be in accordance with the claimed subject matter. Any method that results in the finishing of a microtool such that it is suited for use as a microtool as described herein may be in accordance with at least one embodiment, for example.

It can be appreciated that the embodiments may be applied to the formation of any imprinting tool. Certain features of particular embodiments have been illustrated as described herein, however, many modifications, substitutions, changes and equivalents will now occur to those skilled in the art. Additionally, while several functional blocks and relations between them have been described in detail, it is contemplated by those of skill in the art that several of the operations may be performed without the use of the others, or additional functions or relationships between functions may be established and still be in accordance with the claimed subject matter. It is, therefore, to be understood that the appended claims are intended to cover all such modifications and changes as fall within the true spirit of particular embodiments.

The invention claimed is:

1. A method of forming a substrate-imprinting tool, comprising:
   forming a first mold by use of one or more printing processes;
   forming a second mold from the first mold; and
   forming a substrate-imprinting tool from the second mold, wherein the imprinting tool is formed at least in part by metalizing a portion of the second mold.

2. The method of claim 1, further comprising:
   forming the first mold by depositing layers of curable material on a surface, wherein the material is cured after deposition and built up to desired dimensions;
   cleaning the first mold; and
   depositing a protective layer of material on at least a portion of the first mold.

3. The method of claim 2, further comprising forming the first mold substantially from ultraviolet (UV) curable resin.

4. The method of claim 2, wherein the protective layer substantially comprises metal, wherein the metal is deposited on the first mold by one or more metalization processes.

5. The method of claim 2, further comprising depositing the layers of curable material by use of one or more ink-jet deposition processes.

6. The method of claim 1, further comprising forming the second mold by molding the first mold, wherein the second mold substantially comprises curable polymer.

7. The method of claim 1, further comprising:
   depositing a layer of metal on a least a portion of the second mold;
   allowing the layer of metal to substantially solidify; and
   removing the resultant molded imprinting tool from the second mold.

8. The method of claim 7 further comprising:
   cleaning the imprinting tool; and
   subjecting the imprinting tool to one or more finishing processes, wherein the one or more finishing processes is performed on at least a portion of the imprinting tool, and comprises one of: annealing, machining, or polishing.

9. The method of claim 7, wherein the layer of metal is deposited by use of one or more screen printing processes.

10. The method of claim 7, wherein the layer of metal is deposited by use of one or more sputter deposition processes.

11. A method of forming a substrate-imprinting tool, comprising:
    forming a mold by use of one or more deposition processes; and
    molding a substrate-imprinting tool from the mold, wherein the imprinting tool is formed by metalizing at least a portion of the mold.

12. The method of claim 11, wherein the mold is formed substantially from polymer.

13. The method of claim 12, wherein one of the one or more deposition processes comprises 3-D ink-jet printing.

14. The method of claim 13, wherein the polymer is deposited to an approximate print resolution of 300×600 dots per inch.

15. The method of claim 11, wherein the metalizing is performed by one or more sputter deposition processes.

16. The method of claim 11, wherein the metalizing is performed by one or more screen printing processes.

* * * * *

UNITED STATES PATENT AND TRADEMARK OFFICE
CERTIFICATE OF CORRECTION

PATENT NO. : 7,186,365 B2
APPLICATION NO. : 10/456189
DATED : March 6, 2007
INVENTOR(S) : Walk Page 1 of 1

It is certified that error appears in the above-identified patent and that said Letters Patent is hereby corrected as shown below:

Column 6, line 16, in Claim 7, before "least" delete "a" and insert -- at --, therefor.

Signed and Sealed this

Eighth Day of May, 2007

JON W. DUDAS
*Director of the United States Patent and Trademark Office*

UNITED STATES PATENT AND TRADEMARK OFFICE
CERTIFICATE OF CORRECTION

| | | |
|---|---|---|
| PATENT NO. | : 7,186,365 B2 | Page 1 of 1 |
| APPLICATION NO. | : 10/456189 | |
| DATED | : March 6, 2007 | |
| INVENTOR(S) | : Walk | |

It is certified that error appears in the above-identified patent and that said Letters Patent is hereby corrected as shown below:

In column 6, line 16, in Claim 7, before "least" delete "a" and insert -- at --, therefor.

Signed and Sealed this

Twenty-second Day of May, 2007

JON W. DUDAS
*Director of the United States Patent and Trademark Office*